United States Patent
Shimizu et al.

(10) Patent No.: US 8,759,896 B2
(45) Date of Patent: *Jun. 24, 2014

(54) NON-VOLATILE SEMICONDUCTOR MEMORY USING CHARGE-ACCUMULATION INSULATING FILM

(71) Applicant: Kabushiki Kaisha Toshiba, Tokyo (JP)

(72) Inventors: Tatsuo Shimizu, Tokyo (JP); Koichi Muraoka, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/665,209

(22) Filed: Oct. 31, 2012

(65) Prior Publication Data
US 2013/0062686 A1 Mar. 14, 2013

Related U.S. Application Data

(62) Division of application No. 11/854,090, filed on Sep. 12, 2007, now Pat. No. 8,330,201.

(30) Foreign Application Priority Data

Sep. 29, 2006 (JP) .................................. 2006-267983

(51) Int. Cl.
*H01L 29/76* (2006.01)

(52) U.S. Cl.
USPC ........... 257/314; 257/298; 257/324; 257/326; 257/E29.309; 257/E21.423; 257/E21.679; 257/E27.103

(58) Field of Classification Search
USPC .................. 257/324, 326, 298, 314, E29.309, 257/E21.423, E21.679, E27.103
See application file for complete search history.

(56) References Cited

U.S. PATENT DOCUMENTS

| | | | |
|---|---|---|---|
| 6,139,780 A * | 10/2000 | Desu et al. ..................... | 252/584 |
| 7,763,934 B2 * | 7/2010 | Shimizu et al. ................ | 257/321 |
| 7,986,995 B2 * | 7/2011 | Knudson et al. ................ | 607/40 |
| 2003/0235064 A1 * | 12/2003 | Batra et al. ..................... | 365/100 |
| 2006/0073706 A1 | 4/2006 | Li et al. | |
| 2006/0131633 A1 | 6/2006 | Bhattacharyya .............. | 257/314 |
| 2006/0170033 A1 * | 8/2006 | Lee et al. ....................... | 257/324 |
| 2008/0023744 A1 * | 1/2008 | Shin et al. ...................... | 257/298 |
| 2009/0242970 A1 * | 10/2009 | Shimizu et al. ................ | 257/326 |

FOREIGN PATENT DOCUMENTS

| | | |
|---|---|---|
| JP | 2004-336044 | 11/2004 |
| JP | 2008-34814 | 2/2008 |

* cited by examiner

*Primary Examiner* — Michael Jung
*Assistant Examiner* — John P Dulka
(74) *Attorney, Agent, or Firm* — Oblon, Spivak, McClelland, Maier & Neustadt, L.L.P.

(57) ABSTRACT

There is provided a non-volatile semiconductor memory having a charge accumulation layer of a configuration where a metal oxide with a dielectric constant sufficiently higher than a silicon nitride, e.g., a Ti oxide, a Zr oxide, or a Hf oxide, is used as a base material and an appropriate amount of a high-valence substance whose valence is increased two levels or more (a VI-valence) is added to produce a trap level that enables entrance and exit of electrons with respect to the base material.

14 Claims, 6 Drawing Sheets

NON-VOLATILE SEMICONDUCTOR MEMORY USING CHARGE-ACCUMULATION INSULATING FILM

CROSS-REFERENCE TO RELATED APPLICATIONS

This application is a divisional of U.S. application Ser. No. 11/854,090, filed on Sep. 12, 2007, which claims priority to Japanese Patent Application No. 2006-267983, filed Sep. 29, 2006, the entire contents of which are incorporated herein by reference.

BACKGROUND OF THE INVENTION

1. Field of the Invention

The present invention relates to a non-volatile semiconductor memory using a charge-accumulation insulating film formed by introducing a high-valence substance into a high-dielectric material made of an oxide.

2. Description of the Related Art

In general, a flash memory that is one of non-volatile semiconductor memories is a non-volatile memory that does not require an electrical holding operation (holding power supply) for accumulation, and it is often used in electronic devices since a program and others can be readily written even after completion of a product.

In a NAND flash memory in the next and subsequent generations requiring miniaturization and a low-voltage operation, realization of a flat cell is demanded because of a difficulty in embedding inter-poly-dielectrics (IPD) in a space between cells. In order to realize suppressing an interference between cells and reducing a voltage as well as assuring an electric charge quantity based on a decrease in a contact area of the IPD and a floating gate (FG), a technology of reducing a film thickness of each of the IPD, the FG, and a tunnel film.

However, in an FG structure, a thickness of the tunnel film must be increased to a give value or above to maintain non-volatile, which stands in the way of miniaturization. In case of an FG structure in which electric charges are accumulated in a metal gate film, when a local defect occurs in the tunnel film, a great part of accumulated charges is lost through this defect. One of methods that solve a problem that the tunnel film cannot be reduced in thickness is adoption of a memory cell structure including a discrete charge accumulation layer in place of the FG structure, and a metal-oxide-nitride-oxide-semiconductor (MONOS) is a candidate for this method.

A conventional memory cell including a charge accumulation layer based on the MONOS has a multilayer structure in which a tunnel layer formed of an insulating film (an oxide film), a trap layer formed of a silicon nitride layer, a block layer formed of an insulating film, and a metal gate electrode are formed on a channel region of, e.g., a silicon substrate having a source and a drain formed therein.

Although the above-explained MONOS has a structure in which electric charges are accumulated in a silicon nitride (SiN), an amount of charge accumulation is insufficient, and there is a problem that a large threshold voltage variation range cannot be assured. When an ingenuity, e.g., increasing an amount of silicon is exercised to increase the amount of charge accumulation, a metallic state is obtained, and the same problem as that in the conventional FG structure occurs.

When a silicon nitride is used for the charge accumulation layer, a sufficient driving voltage must be applied to a tunnel film part, thereby making it difficult to realize a low-voltage operation. Further, a technology of excessively taking out electrons when erasing data to assure a sufficient threshold variation range cannot be applied to the charge accumulation layer of the silicon nitride. That is mainly because a large energy is required to further take out electrons after a state with no writing operation is achieved based on electrons. Furthermore, in the silicon nitride film, a charge trapping efficiency is poor, and threshold controllability is bad. That is because a dielectric constant is low and hence a charge trapping cross-section area is small.

Moreover, there is also an attempt to expose, e.g., $TiO_2$ to a plasma damage in place of the silicon nitride, thereby creating a charge accumulation film. In this case, electric charges are accumulated based on occurrence of a large quantity of oxygen defects, but oxygen defects in an ionic oxide have general properties of producing a state close to a conduction band bottom. Therefore, when $TiO_2$ or $HfO_2$ as an ionic oxide is damaged to produce a charge accumulation layer, the accumulation layer behaves like an n-type semiconductor, and electric charges are lost due to a local defect in a tunnel film. That is, the charge accumulation layer using oxygen defects in, e.g., $TiO_2$ has a structure that is theoretically weak in relation to electric charge holding.

For example, JP-A 2004-336044 (KOKAI) proposes a solution of this problem. JP-A 2004-336044 (KOKAI) discloses a technology of introducing an lanthanoid element into $HfO_2$, $ZrO_2$, or $TiO_2$ as a charge accumulation layer. For example, in addition of La (other lanthanoid substances can be likewise added), La is a trivalent additive, a substance of +trivalence is introduced in place of +tetravalence, and oxygen becomes deficient for electric charge compensation, thereby realizing stability. In this oxygen defect, electrons cannot be stored, and an n-type-like behavior is observed. Therefore, many electric charges cannot be accumulated, and density growth of electric charges based on dopant introduction is hard to be realized.

BRIEF SUMMARY OF THE INVENTION

According to an embodiment of the present invention, there is provided a non-volatile semiconductor memory comprising: a semiconductor substrate having a source region and a drain region provided therein to form a gap serving as a channel region therebetween; and a gate multilayer material that has both ends provided on the source region and the drain region and is formed on the channel region, wherein the gate multilayer material is obtained by sequentially stacking: a first insulating layer that is formed on the channel region; a charge accumulation layer that is formed of an oxide dielectric material in which at least one of Tc, Re, Ru, Os, Rh, Ir, Pd, Pt, Co, Ni, W, Mo, Cr, Mn, and Fe as a substance having a higher valence than titanium (Ti), zirconium (Zr), and hafnium (Hf) is introduced as an additive substance and which includes at least one of Ti, Zr, and Hf; a second insulating layer having a dielectric constant higher than the first insulating layer; and a memory gate electrode.

Further, the non-volatile semiconductor memory includes: a semiconductor substrate having a source region and a drain region provided therein to form a gap serving as a channel region therebetween; and a gate multilayer material that has both ends provided on the source region and the drain region and is formed on the channel region, and the gate multilayer material is constituted by sequentially stacking: a first insulating layer formed on the channel region; a charge accumulation layer in which at least one of Tc, Re, Ru, Os, Rh, Ir, Pd, Pt, Co, and Ni as substances having valences higher than titanium (Ti), zirconium (Zr), or hafnium (Hf) is introduced as an additive substance into an oxide dielectric film including at least one of Ti, Zr, and Hf in such a manner that an area density falls within a range of $1\times10^{12}$ to $2\times10^{14}$ cm$^{-2}$; a second insulating layer having a dielectric constant higher than the first insulating layer; and a memory gate electrode.

Furthermore, the non-volatile semiconductor memory includes: a semiconductor substrate having a source region and a drain region provided therein to form a gap serving as a channel region therebetween; and a gate multilayer material that has both ends provided on the source region and the drain region and is formed on the channel region, and the gate multilayer material is constituted by sequentially stacking: a first insulating layer formed on the channel region; a charge accumulation layer in which at least one of W, Mo, Cr, Mn, and Fe as substances having valences higher than titanium (Ti), zirconium (Zr), or hafnium (Hf) is introduced as an additive substance into an oxide dielectric film including at least one of Ti, Zr, and Hf in such a manner that an area density falls within a range of $1\times10^{12}$ to $1\times10^{14}$ cm$^{-2}$; a second insulating layer having a dielectric constant higher than the first insulating layer; and a memory gate electrode.

Moreover, the non-volatile semiconductor memory includes: a semiconductor substrate having a source region and a drain region provided therein to form a gap serving as a channel region therebetween; and a gate multilayer material that has both ends provided on the source region and the drain region and is formed on the channel region, and the gate multilayer material is constituted by sequentially stacking: a first insulating layer formed on the channel region; a charge accumulation layer in which at least one of Tc, Re, Ru, Os, Rh, Ir, Pd, Pt, Co, Ni, W, Mo, Cr, Mn, and Fe as substances having valences higher than titanium (Ti), zirconium (Zr), or hafnium (Hf) is introduced as an additive substance into an oxide dielectric film including at least one of Ti, Zr, and Hf in such a manner that an area density falls within a range of $5\times10^{12}$ cm$^{-2}$ to $0.7\times10^{14}$ cm$^{-2}$; a second insulating layer having a dielectric constant higher than the first insulating layer; and a memory gate electrode.

DETAILED DESCRIPTION OF THE INVENTION

Embodiments according to the present invention will now be explained hereinafter with reference to the accompanying drawings.

In a non-volatile semiconductor memory (a charge accumulation type of memory) according to this embodiment, as shown in later-explained FIG. 1, a source region (S) 3 and a drain region (D) 2 are formed on a semiconductor substrate 1 to have a distance serving as a channel region as a current path through which data is transmitted therebetween. A gate multilayer material that controls memory operations (writing, reading, and erasing) is provided on this channel region. The gate multilayer material is a multilayer film formed of a first insulating layer (a tunnel layer)/a charge accumulation layer/a second insulating layer (a block layer)/a memory gate electrode 7(a writing/reading/erasing control electrode) on a silicon (Si) substrate. A distance (a channel length) between the source region 3 and the drain region 2 is a distance that is appropriately set based on design specifications of the memory, and it is formed as the channel region.

This charge accumulation layer is configured to add an appropriate amount of a high-valence material in a substance having a dielectric constant sufficiently higher than a silicon nitride film as a base material to produce a trap level enables taking out and putting in electrons with respect to the base material. A concept of this charge accumulation type of memory will now be explained hereinafter.

In the charge accumulation type of memory, as a result of adding a high-valence substance to a metal oxide having a dielectric constant sufficiently higher than a silicon nitride, e.g., a Ti oxide, a Zr oxide, or a Hf oxide, the following knowledge was obtained. It is to be noted that, as a manufacturing method of a high-dielectric film formed of a metal oxide having a high dielectric constant, e.g., a Ti oxide, a Zr oxide, or a Hf oxide, a present typical film forming method, e.g., one of chemical vapor deposition (CVD), atomic layer deposition (ALD), molecular beam epitaxy (MBE), sputtering, evaporation, and combining laser irradiation after application can be used.

Oxygen defects are produced in the high-dielectric film using such a manufacturing method. As a result, the dielectric film becomes an n-type semiconductor, and electric charges are lost when a local defect is present in a tunnel layer. Thus, when an appropriate amount (an amount which does not allow forming a band) of a later-explained high-valence substance, a level is produced in a gap, and an effect of trapping electrons or taking out electrons occurs. Since the level is produced in the gap, electric charges are not lost even if a local defect is present in the tunnel layer. Furthermore, even if an oxygen defect is produced in the charge accumulation layer, excessive electrons can be dropped in the level in the gap, and hence electric charges are not lost.

Characteristics of the level produced in the high-dielectric film having an appropriate amount of the high-valence substance introduced therein will now be explained. The following characteristics are the fact that was revealed by a first-principles calculation in a development process of the charge accumulation layer.

The first-principles calculation will be briefly explained. It is an electronic state calculation based on a density functional method using an ultra-soft pseudo-potential. Potentials of, e.g., respective elements (titanium, oxygen, and others) have been already used in various forms, and they are very reliable. In this embodiment, a very accurate calculation is carried out. For example, a lattice constant obtained by the calculation has an error that is not greater than 0.6% as compared with an experimental value. In general, in a calculation of a dielectric substance, an accuracy of the lattice constant is very important, but this calculation has achieved a sufficient accuracy.

A base material will now be explained. First, as the base material, the charge accumulation layer having a high dielectric constant is used. This enables reducing a voltage applied to the charge accumulation layer and applying a greater part of the application voltage to the tunnel layer. As a result, memory operations with a low voltage are enabled. At this time, when a dielectric constant of the second insulating layer (a block layer) used to trap electric charges is also increased, the voltage can be further reduced.

Figure 5:
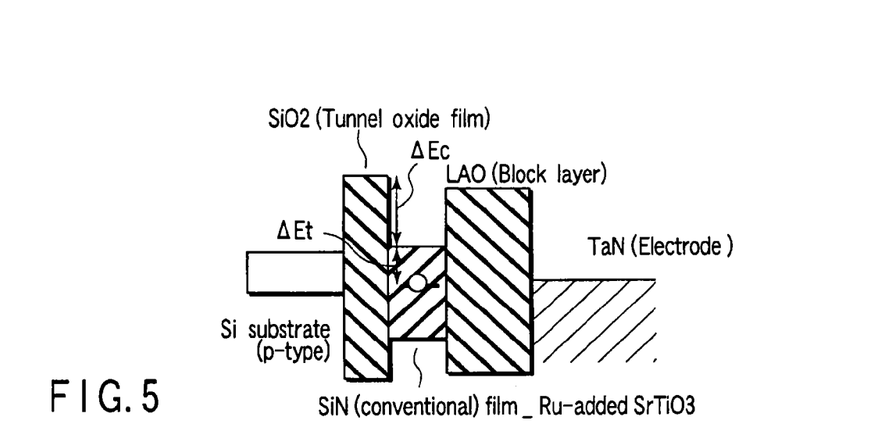
FIG. 5 is a view schematically showing a band structure of a multilayer film in the memory cell according to the first embodiment.

For example, if a Ti oxide is used, 30 to 1000 can be realized as a high dielectric constant. Moreover, if a Zr oxide or a Hf oxide is used, a dielectric constant of 20 to 30 can be realized. When the Ti oxide is used, a high dielectric constant that is approximately 1.5 to 50 times those of the Zr and Hf oxides can be expected. Therefore, the Ti oxide is most preferable as the base material. Additionally, in general, a substance having a high dielectric constant has a tendency that $\Delta Ec$ depicted in FIG. 5 is increased. This point is also one of merits obtained when the Ti oxide is used as the material.

An additive substance will now be explained. Even if a substance having a low valence is added to a high-dielectric material, e.g., a Ti oxide, a Zr oxide, or a Hf oxide having an IV-valence, a level is not basically produced in the gap. That is because an oxygen defect is produced by a heat treatment (e.g., an annealing process) performed during the manufacturing process, thereby stabilizing a film structure. This is also true in introduction of nitrogen. This oxygen defect state appears near a conduction band bottom and spreads there, and hence electric charges cannot be accumulated with a high concentration. Further, when V, Nb, or Ta whose valence is increased one level (a V-valence) is added, although the level is produced, it appears near the conduction band bottom, a structure with supplied electrons is realized, thereby demonstrating an n-type-like behavior. Even if this state is used like the above example, electric charges cannot be accumulated with a high concentration.

Furthermore, when a substance whose valence is increased two levels (a VI-valence) is added, a calculation result suggests that a position of the level in the gap produced due to addition of a small amount moves toward the inside of the gap. In this embodiment, at least one of Ti, Zr, and Hf is determined as a metal constituting a base oxide, and Ti, Zr, or Hf is substituted by a high-valence substance. Based on a calculation, when Tc, Re, Ru, Os, Rh, Ir, Pd, Pt, Co, Ni, W, Mo, Cr, Mn, or Fe is an additive, a level is produced in the band gap.

At this time, a part of the produced level is loaded with electrons, and another part of the same is free from electrons.

Figure 3:
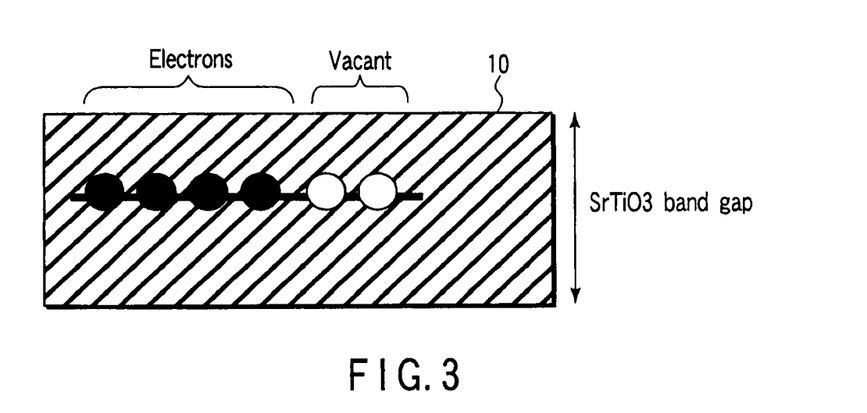
FIG. 3 is a view schematically showing an energy level of Ru inside the band gap of SrTiO3.

FIG. 3 is a schematic view when Ru is introduced into $SrTiO_3$. When electrons are injected into the vacant level, negative electric charges are accumulated. Moreover, when already present electrons are taken out, positive electric charges are accumulated as compared with a state before taking out. Based on such characteristics, a large threshold variation which greatly fluctuates to both the positive and negative sides can be designed. Of course, injecting holes can be also considered depending on an operating conformation.

According to a structure conforming to a later-explained embodiment, both electrons and holes can be taken out and put in with respect to a produced level. As a result, for example, a scheme that electrons are injected in a writing operation and holes are injected in an erasing operation can be realized.

The additive substance is introduced in place of Ti, Zr, or Hf as the base material, and it is characterized in that a vacant state (a state where electrons can be introduced) is produced in the band gap. In particular, the greatest characteristics of a substance having a perovskite structure, e.g., $SrTiO_3$, $SrZrO_3$, $SrHfO_3$, or $Sr(Ti, Zr)O_3$ lie in that an additive substance is introduced into a central position of an oxygen octahedron called a B site. For example, a point that W or the like substitutes for Ti in $SrTiO_3$ is very important.

At this time, a local state where electrons can be introduced into the $SrTiO_3$ gap emerges. On the other hand, a state where a plurality of existing dielectric films are simply mixed, e.g., a state where $SrTiO_3$ and $WO_3$ are simply mixed is not considered. In a mixture obtained by simply mixing $SrTiO_3$ and $WO_3$, the local state where the electrons can be introduced into $SrTiO_3$ does not appear.

Additionally, substances can be further refined based on stability. For example, there are Os, Ru, Ir, and Rh.

An energy of 5.2 eV is required per half of an oxygen molecule ($\frac{1}{2}O_2$) in order to produce an oxygen defect in the tunnel layer $SiO_2$. It is considered that an energy of 4.7 eV is required per half of an oxygen molecule ($\frac{1}{2}O_2$) in order to produce an oxygen defect in the block layer $LaAlO_3$. It is to be noted that other tunnel layers and block layers also require an energy of 4.7 eV. As explained above, approximately the same energy is required to take out oxygen from an oxide.

If a stabilization energy when an additive metal (e.g., Ru) is oxidized is sufficiently lower than 4.7 eV, it can be expected that an oxygen defect is not produced by taking out oxygen from the tunnel layer and the block layer arranged on both sides of the charge accumulation layer. Therefore, it can be said that the metal additive having a small stabilization energy based on oxidation is a very effective additive substance. As corresponding additives, there are Os, Ru, Ir, and Rh.

In regard to additive substances for other high-valence metals, they are stable as oxides, and hence taking out oxygen from the layers on both sides usually cannot occur. However, when an oxygen defect is produced in the charge accumulation layer, substances other than Os, Ru, Ir, and Rh may possibly produce an oxygen defect in the oxide films on both sides. In this case, a process of supplying an appropriate amount of oxygen in film formation of the charge accumulation layer to prevent an excessive oxygen defect from being produced in the charge accumulation layer must be adopted.

An optimum amount of an additive substance to be added will now be explained.

A lower limit of an additive amount will be first described. A lower limit of an additive amount when an additive substance is distributed in the charge accumulation layer with an area density $\delta$ [$C/cm^2$] will be explained. At this time, it is that a change in a threshold value due to stored charges is approximately $Vth[V] \approx 1.8 \times 10^{-13} \times \delta$. However, a change of a single digit or so may occur in dependence on a film thickness or a dielectric constant of each dielectric film. In regard to a meaningful range as a Vth shift amount, if an area density at an interface is not smaller than $1 \times 10^{12}$ cm$^{-2}$, a change in Vth that is approximately ±0.2 eV can be obtained, which is effective. Further, if the area density is not smaller than $5 \times 10^{12}$ cm$^{-2}$, a sufficient shift amount (±1.0 eV) can be assured.

An upper limit of an additive amount will now be explained. In a later-explained embodiment, a keynote lies in that an additive substance having a high valence substitutes for an element constituting an oxide. That is, if a mixture of oxides is just processed, there are no condition about a mixing ratio. On the other hand, a charge accumulation material in which a metal additive substance, e.g., W or Ru substitutes for a metal Ti in a base material, e.g., an oxide TiO$_2$ is adopted rather than a mixture of oxides. When this charge accumulation material is used, there is an upper limit in an amount of a metal additive substance.

In this embodiment, an added substance does not form a band in a gap of a dielectric material. If the band is formed, electric charges do not locally present, and the memory becomes equivalent to an FG-type charge accumulation memory. As a rough standard of formation of the band, an additive substance (Tc, Re, Ru, Os, Rh, Ir, Pd, Pt, Co, or Ni) enters a 2a×2a×2a unit structure, where a is a lattice constant. This phenomenon occurs due to a fact that an inherent energy level of an element forming an in-gap state is far from an inherent energy level of an element in a base material and hence an interaction with the base material is not large from the beginning. On the contrary, if an additive element is not present in the 2a×2a×2a unit structure, the band is not formed.

Therefore, the upper limit is represented as $2.0 \times 10^{14}$ cm$^{-2}$ when converted into an area density. Moreover, in a substance having a stable oxide (W, Mo, Cr, Mn, or Fe), since electric charges may possibly spread through the interaction with respect to oxygen, a state where the number of the additive substance present in a 2.5a×2.5a×2.5a unit structure is one is required. Therefore, when the upper limit is represented as an area density, it is $1.0 \times 10^{14}$ cm$^{-2}$.

Moreover, when electric charges are introduced, the level tends to increase, and hence it approximates a level of the base material. At this time, in order to prevent the interaction from affecting through the inherent level of the base material, a state where the number of the additive substance present in a 3a×3a×3a unit structure is one is preferable. Therefore, representing the upper limit in this embodiment as an area density, $0.7 \times 10^{14}$ cm$^{-2}$ is more preferable.

Figure 1:
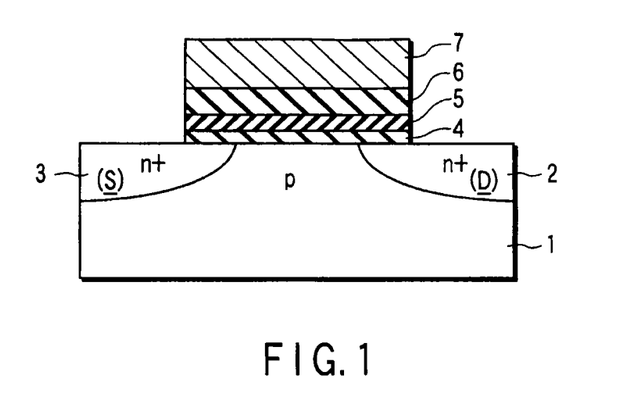
FIG. 1 is a cross-sectional view showing a primary part of a memory cell according to a first embodiment.

FIG. 1 is a cross-sectional view showing a primary part of a cell in a non-volatile semiconductor memory cell according to a first embodiment. FIG. 5 is a view schematically showing a band structure of a multilayer film constituted of a first insulating layer (a tunnel layer)/a charge accumulation layer/a second insulating layer (a block layer)/a memory gate electrode (a writing/reading/erasing control electrode) 7 on a silicon (Si) substrate.

As shown in FIG. 1, a source region (S) and a drain region (D) 2 are formed on a semiconductor substrate 1 with a distance serving as a channel region as a current path through which data is transmitted therebetween. A gate multilayer material that controls memory operations (writing, reading, and easing) is provided on this channel region. A distance (a channel length) between the source region 3 and the drain region 2 is a distance that is appropriately set based on design specifications of the memory, and it is formed as a channel region.

This gate multilayer material is formed by sequentially stacking a tunnel layer 4 as the first insulating layer, a trap layer 5 as the charge accumulation layer, a block layer 6 as the second insulating layer having a high dielectric constant, and a memory gate electrode 7. Particulars of each layer will now be described.

The tunnel layer 4 on the channel region is formed in such a manner that its both ends reach the source region 3 and the drain region 2, respectively. This tunnel layer 4 is formed of a silicon oxide film having a low dielectric constant, and its film thickness is 0.5 to 5 nm. In this embodiment, a film thickness of 2.4 nm is adopted. It is good enough for the tunnel layer 4 to have a low dielectric constant and enable maintaining a barrier. The tunnel layer 4 is constituted of not only a single-layer SiO$_2$ film but also one of a silicon oxynitride film and a silicon nitride film, or a multilayer film of these. For example, it may be a multiple film of SiO$_2$/Si$_3$N$_4$/SiO$_2$ and others.

In order to enable a normal operation in a conventional floating gate (FG) memory, a thickness of the tunnel layer 4 cannot to be reduced to, e.g., 7 nm or below. Like this embodiment, when the discrete charge accumulation layer 5 is introduced, a film thickness that is not greater than 5 nm can be formed, and a reduction in film thickness of the tunnel layer can be realized.

In this embodiment, since using a high-dielectric material for the charge accumulation layer 5 enables applying an almost all of an application voltage to the tunnel layer 4, a voltage required for memory operations can be sufficiently reduced, thus realizing low-voltage driving. Furthermore, an effect obtained based on this reduction in voltage also enables decreasing an application voltage to the block oxide film, and preventing electrons from being injected from an electrode side when erasing stored data can effectively function. That is, injection of electrons on the electrode side can be suppressed.

When a predetermined voltage is applied to each of the memory gate electrode 7 and the drain region 2, electrons transmitted through the tunnel layer 4 are trapped in the charge accumulation layer 5. In this embodiment, an SrTiO$_3$ film (a film thickness: 6 nm) having a high dielectric constant of 300 is used as the charge accumulation layer 5. For example according to a film forming method of the charge accumulation layer 5, the silicon substrate 1 is heated, and SrRuO$_3$ is simultaneously sputtered using an SrTiO$_3$ target and an SrRuO$_3$ target in an atmosphere of an oxygen/nitrogen/Ar mixed gas, thereby introducing Ru. After film formation, an annealing process is carried out in an oxygen atmosphere.

Figure 4:
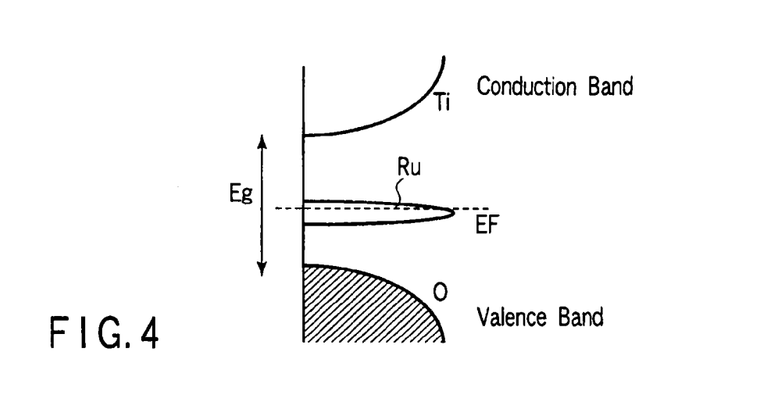
FIG. 4 is a view schematically showing a density of states Ru-doped SrTiO3.

In this embodiment, converting an amount of Ru introduced when forming the film into an area density, it is, e.g., $3.5 \times 10^{13}$ cm$^{-2}$, thereby obtaining a large quantity of accumulated charges. At this time, as shown in FIG. 4, Ru forms a level in an SrTiO$_3$ gap, and 66.7% of the level is loaded with electrons. Some or all of remaining 33.3% can be loaded with electrons as shown in FIG. 3. Moreover, electrons present in 66.7% can be partially or entirely taken out. That is, when erasing data, excessively taking out electrons is easy, or injecting holes is also easy, thus shifting a threshold voltage to a negative side. Based on such a structure, a large threshold shifting range in a short time can be assured, which is advantageous in an accumulation operation and an erasing operation.

As explained above, in a conventional silicon nitride film, trapping holes or excessively taking out electrons is very difficult. Therefore, a sufficient threshold shifting range cannot be assured. On the other hand, according to this embodiment, a large threshold shifting range based on excessively taking out electrons can be assured, and a high-speed erasing operation can be performed.

Additionally, in the charge accumulation layer 5 according to this embodiment, an energy level for charge accumulation is present at a very deep position as shown in FIG. 5. Therefore, leakage of electric charges is considerably suppressed as compared with the silicon nitride film. When the charge accumulation layer 5 is formed of a titanium oxide, ΔEc depicted in FIG. 5 is as very large as 3.5 eV. If Ru is used, a trap level AEt also becomes as very large as approximately 1.7 eV. It is to be noted that, in a general silicon nitride film, ΔEc≈1.1 eV and ΔEt≈0.8 eV are achieved.

It is to be noted that ΔEt varies depending on an additive substance, but 0.5 eV or above can be assured in case of an additive substance used in this embodiment (Tc, Re, Ru, Os, Rh, Ir, Pd, Pt, Co, Ni, W, Mo, Cr, Mn, or Fe). Further, when a Hf oxide or a Zr oxide is used for the base material, ΔEc is approximately 2.0 eV that is smaller than that in a titanium oxide. However, a trap level is deeper than that of a titanium oxide, and ΔEt of 1.5 eV can be assured. As explained above, according to this embodiment, a material which greatly deepens a depth of a trap level (ΔEc+ΔEt in FIG. 5) is specified, and an advantage that performance of preventing accumulated charges from being taken out is utilized.

Moreover, when Ti and Zr (Hr can be also applied) are included, considering that a band gap is formed in accordance with a ratio of these substances, results are completely the same. For example, Sr(Ti, Zr)O$_3$ is a dominant base material, substituting Ti or Zr by Ru enables forming an effective charge accumulation film.

As explained above, when "retention of a large quantity of accumulated charges" and "high performance of preventing accumulated charges from being taken out" of the charge accumulation layer 5 are utilized, a film thickness of the tunnel layer 5 can be further reduced as compared with a conventional memory in which a silicon nitride film is used for the charge accumulation layer, which suggests realization of a further reduction in film thickness of the tunnel layer 5. As a result, high-speed operation can be realized in all of the writing operation, the erasing operation, and the reading operation of data.

Additionally, according to this embodiment, a film thickness of the tunnel layer 5 can be reduced to several nm or below, which is very effective in suppressing an interaction between cells. The present invention is very effective as a technology of advancing scaling in accordance with a demand of future integration and miniaturization and forming a memory in a generation where an ITRS (International Technology Roadmap for Semiconductors) half-pitch is smaller than 30 nm.

Further, considering an example where electric charges are entirely reversed, it is apparent that the present invention can be modified to trap holes. However, in a conventional silicon nitride film, trapping holes is difficult. Therefore, a method of performing writing based on injecting electrons and effecting erasing based on taking out electrons is adopted. In the charge accumulation layer according to this embodiment, a structure where holes are trapped can be readily employed, and hence considering a state where electric charges are reversed is also possible.

As explained above, according to the non-volatile semiconductor memory of this embodiment, a quantity of accumulated charges can be greatly improved to considerably increase a threshold shifting range, and a greater part of a voltage applied to a space between the gate and the channel can be applied to the tunnel layer, thus enabling memory operations at a high speed with a low voltage.

A first modification of the first embodiment will now be explained.

Figure 2:
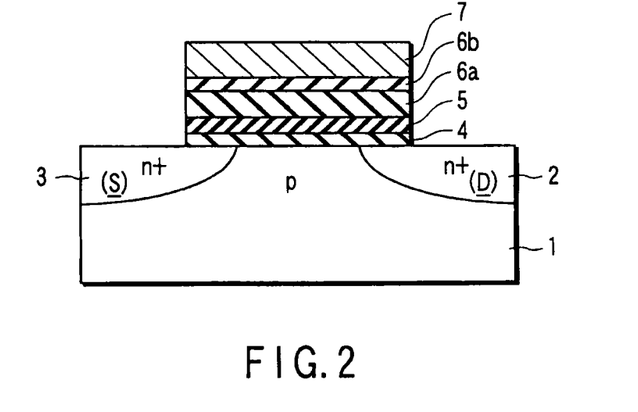
FIG. 2 is a cross-sectional view showing a structure having a block layer of a multilayer structure according to a first modification of the first embodiment.
Figure 6:
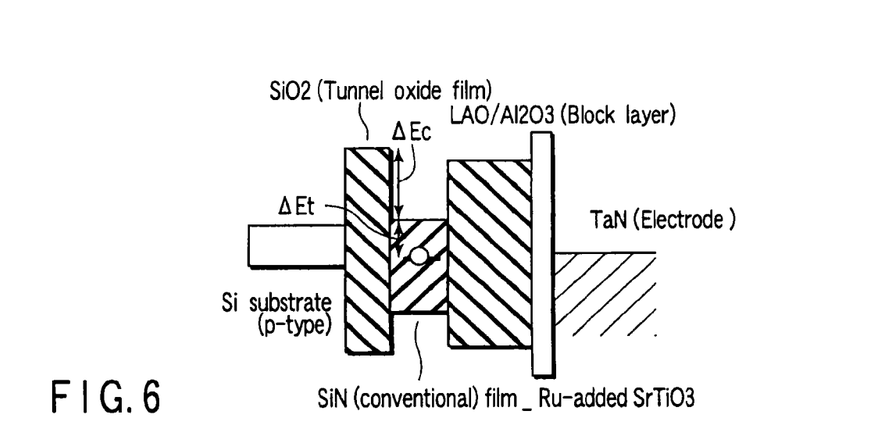
FIG. 6 is a view schematically showing a band structure in which a block film is a multilayer film according to the first modification.

FIG. 2 is a cross-sectional view showing a primary part of a memory cell according to the first modification. FIG. 6 is a view schematically showing a band structure of a multilayer film constituted of a first insulting layer (a tunnel layer)/a charge accumulation layer/a second insulating layer (a block layer)/a memory gate electrode (a writing/reading/erasing control electrode) on a silicon substrate.

As shown in FIG. 2, this first modification has a multilayer structure where the insulating layer 6 serving as a block layer is constituted of a first insulating layer 6a and a second insulting layer 6b. This second insulating layer 6b controls entrance and exit of electrons from the charge accumulation layer 5 to the memory gate electrode 7. At the time of holding or memory reading, a state where electrons are trapped is important. At the time of erasing data, preventing electrons from being injected from an electrode side is important. This electron injection prevention is most effective when a substance having a high dielectric constant is used to avoid application of a voltage. Therefore, in this modification, a film formed of at least one of materials having high dielectric constants, i.e., LaAlO$_3$, Al$_2$O$_3$, AlN, AlNO, ZrO$_2$, SrZrO$_3$, (Ba, Sr, Ca)ZrO$_3$, La$_2$Zr$_2$O$_7$, HfO$_2$, SrHfO$_3$, (Ba, Sr, Ca) HfO$_3$, and La$_2$HfO$_7$, or a multilayer film obtained by stacking the plurality of films is used.

Further, using the memory gate electrode 7 having a large work function to heighten an electron barrier is also effective. Positive electric charges are accumulated in the block layers 6a and 6b even though the work function is increased, and a state where a barrier of each of the block layers 6a and 6b is low is the same as a state where the work function is small. In order to avoid this problem, in this embodiment, an Al$_2$O$_3$ film is used for the block layer 6b side as shown in FIG. 6. In addition to the block layer 6a, the block layer 6b in which, e.g., an Al$_2$O$_3$ film, an LaAlO$_3$ film enriched with Al, an AlN film, or an AlNO film is introduced is used on the electrode 7 side.

Based on such a structure, occurrence of positive fixed electric charges in the block layers can be avoided, and the barrier for electrons is heightened. That is, if an electrode with a high work function is used, stacking an Al$_2$O$_3$ film (the block layer 6b) on an interface between the electrode 7 and the block layer 6a is effective. This structure enables efficiently avoiding introduction of electrons from the electrode 7 side when erasing data. In this embodiment, as shown in FIG. 2, a structure of an LaAlO$_3$ film (5 nm)/an Al$_2$O$_3$ film (1 nm)/a TaN is proposed.

A region setting concerning a metal-rich layer will now be explained.

When a region or a thin film that deviates from the stoichiometry to a metal-rich side is included, a potential of the block layer can be controlled. An example where an "excessively introduced metal" is concentrated in a width of approximately 1 nm in a film thickness direction and it is distributed with an area density of σ [C/cm$^2$] will be explained. In this example, a change in potential is approximately V[V]≈1.8× 10$^{-14}$×σ. A range that is meaningful as a potential shift amount V will be described.

If a change is 0.1[V] or above with respect to a film thickness of 1 nm, it can be considered that a probability of tunneling is reduced to approximately 10%, and hence a shift of 0.1[V] or above is very important as a potential. If V can be changed 1.0[V] or above, a tunneling probability can be improved three digits or more as compared with a state before a change. However, a barrier on a hole side is lowered, and hence it can be considered that 1.0[V] is an upper limit. That is, considering a potential shift V, a range of 0.1 to 1.0[V] is meaningful, and deviating from this range is meaningless.

Therefore, a range of $5\times10^{12}$ to $5\times10^{13}$ cm$^{-2}$ is preferable as an area density of the "excessively introduced metal". However, if a distribution of the "excessively introduced metal" in a film thickness direction is also considered, a change that is approximately half as a lower limit and approximately twice as an upper limit is not improbable. Therefore, considering the distribution of the "excessively introduced metal" in the film thickness direction, an optimum an area density of the "excessively introduced metal" falls within the range of $2.5\times10^{12}$ to $1\times10^{14}$ cm$^{-2}$.

A second modification of the first embodiment will now be explained.

The second modification provides a structure where a base material of the charge accumulation layer 5 is changed from SrTiO$_3$ to TiO$_2$. A multilayer structure is equal to that depicted in FIG. 2.

In a film forming method of the charge accumulation layer, a TiO$_2$ target and an RuO$_2$ target is used as a target to perform simultaneous sputtering in an oxygen/nitrogen/Ar mixed gas atmosphere like the film forming method using SrTiO$_3$. After film formation, an annealing process is effected in an oxygen atmosphere.

TiO$_2$ subjected to film formation has a rutile structure. When an amount of introduced Ru is converted into an area density, it is $5.0\times10^{13}$ cm$^{-2}$. As a result, a large charge accumulation amount can be obtained. At this time, Ru forms a level in a TiO$_2$ gap, 66.7% of the level is loaded with electrons. A part or all of remaining 33.3% can be loaded with electrons, which is the same as the above example.

Further, the electrons put in the level can be partially or entirely taken out, which is also the same as the above example. That is, excessively taking out the electrons is easy (or injecting holes is easy) when erasing data, and a threshold voltage can be shifted to a negative value. As a result, a large threshold shifting range can be assured a short time, which is advantageous in writing/reading/erasing operations (assuring a large threshold shifting range/high-speed erasing based on excessive extraction of electrons). Although a difference between the base material formed of SrTiO$_3$ and the base material formed of TiO$_2$ lies in that a dielectric constant is 300 in case of SrTiO$_3$ but it is reduced to 100 in case of TiO$_2$. On the other hand, since a TiO$_2$ film includes Ti alone as a component, a process steps become simple, and a cost can be suppressed.

A third modification of the first embodiment will now be explained.

This third modification is a structure where a metal-rich layer is introduced into a part of the block layer like the second modification. The structure is the same as the multilayer structure depicted in FIG. 2.

Since negative electric charges are introduced into this metal-rich layer, an electron barrier is increased, and block performance with respect to electrons is considerably improved. The structure includes a silicon (Si) substrate/an SiO$_2$ tunnel layer (2.4 nm)/an SrTiO$_3$:Ru (6 nm)/LaAlO$_3$ (5 nm)/Al-rich Al$_2$O$_3$ (1 nm)/a TaN electrode.

Figure 7:
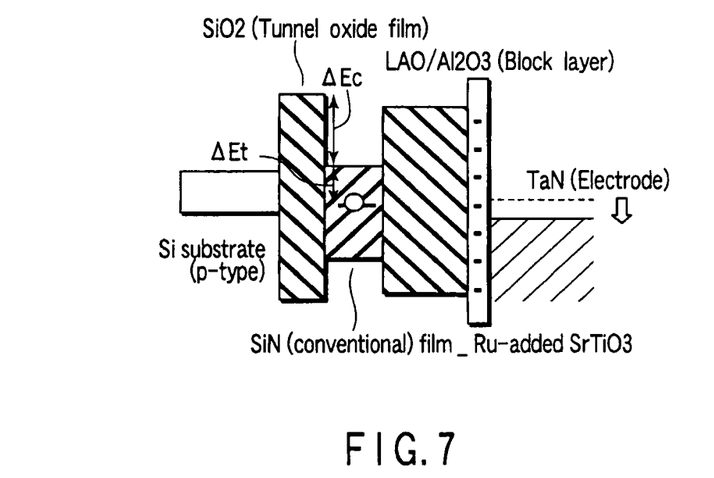
FIG. 7 is a view schematically showing a band structure in which a block film is a multilayer film according to the third modification.

A voltage when erasing data can be further increased as compared with the structure according to the first embodiment, and hence data can be erased at a higher speed. In a band structure, an electron barrier seems high as seen from the electrode side as depicted in FIG. 7. Here, a film in which Al is excessively introduced with respect to Al$_2$O$_3$ is formed, but an amount of excessive Al in the Al-rich Al$_2$O$_3$ film is $1\times10^{13}$ cm$^{-2}$.

The third modification has an effect that an abundant quantity of electric charges can be taken, excessively taking out electrons from the charge accumulated layer enables changing Vth to a negative value, and realizing multiple values is also easy.

As explained above, according to this embodiment and the first to third modifications, when the charge accumulation film with a high dielectric constant based on a Ti oxide with a dielectric constant of 30 to 1000, a Zr oxide or a Hf oxide with a dielectric constant of 20 to 30 is used, a greater part of an application voltage can be applied to the tunnel layer, thereby enabling operations at a high speed with a low driving voltage. At this time, when the second insulating layer (the block layer) is formed into a multilayer film and a dielectric constant is also increased, the voltage can be further reduced.

Moreover, when the base material is formed of an oxide of Ti, Zr, or Hf and a high-valence substance is added, a level can be produced in a band gap and very deep, stable and sufficient charge accumulation can be obtained. The tunnel layer and the block layer can be reduced in thickness, thereby realizing a high-speed operation.

A second embodiment according to the present invention will now be explained.

Figure 8:
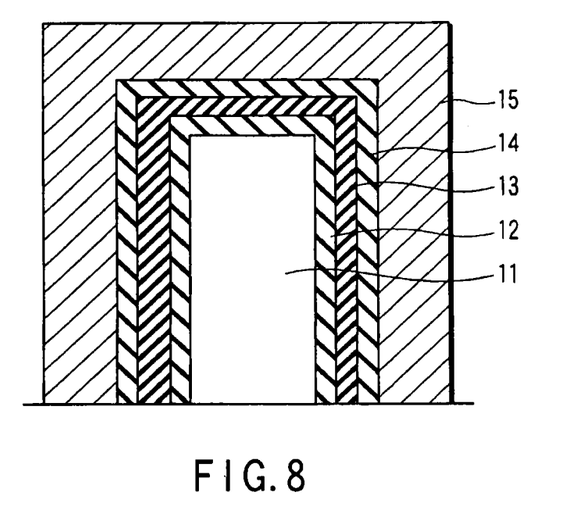
FIG. 8 is a cross-sectional view showing a MONOS memory structure using a FinFET from a lateral side as a non-volatile semiconductor memory according to a second embodiment.
Figure 9:
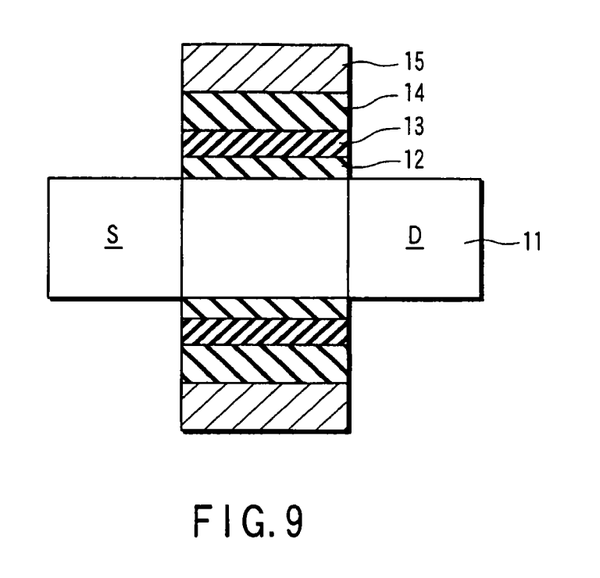
FIG. 9 is an orthograph showing the MONOS memory structure using the FinFET from above as the non-volatile semiconductor memory according to the second embodiment.

A non-volatile semiconductor memory according to the second embodiment depicted in FIGS. 8 and 9 is a charge accumulation memory applied to a Fin structure. An example where a FinFET-type charge accumulation memory to which an STI technology using, e.g., a CVD method or an ALD method is applied is formed will be explained.

As shown in a side view of FIG. 8, as this memory, a MONOS-type charge accumulation memory is constituted by sequentially covering a periphery of an Fin portion 11 formed of Si with a tunnel layer 12, a charge accumulation layer 13, a block layer 14, and an electrode 15 in a cap-like form in such a manner that these members overlap each other.

As shown in a top view of FIG. 9, in this memory, the Fin portion 11 is formed in such a manner that the tunnel layer 12 covers a channel portion as seen from above, and a source portion and a drain portion respectively extend on both sides to come into contact with external elements. When a thickness of the channel portion of this Fin portion 11 is optimized, a threshold value can be greatly changed. It is to be noted that an FinFET on an SOI can be likewise formed. When the FinFET structure is used, operations can be performed at a higher speed.

A modification of the second embodiment will now be explained.

Figure 10:
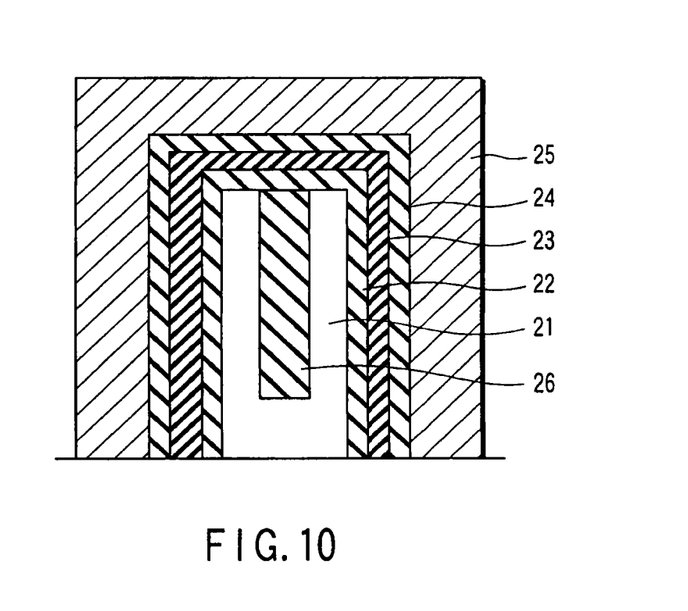
FIG. 10 is a cross-sectional view of a Fin portion having an embedded barrier film provided therein in a non-volatile semiconductor memory according to a modification of the second embodiment.

As shown in FIG. 10, this modification constitutes a MONOS-type charge accumulation memory by sequentially covering a periphery of an Fin portion 21 formed of Si with a tunnel layer 22, a charge accumulation layer 23, a block layer 24, and an electrode 25 in a cap-like shape in such a manner that these members overlap each other.

Figure 11:
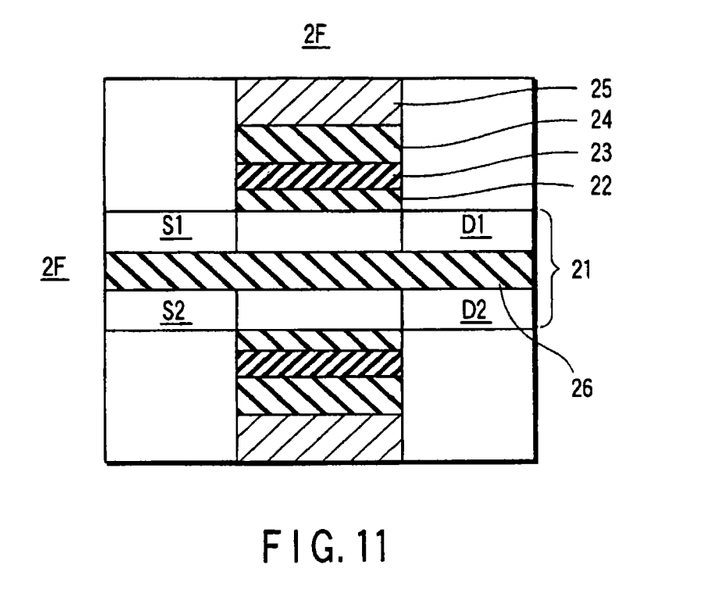
FIG. 11 is a cross-sectional view showing the Fin portion having the embedded barrier film provided therein from above in the non-volatile semiconductor memory according to the modification of the second embodiment.

In this structure, as shown in FIG. 11, an embedded barrier layer 26 is formed in an Fin portion 21 as seen from above, and the Fin portion 21 is divided into two. When this barrier layer 26 is formed of the same substance (SiO$_2$ or SiON) as the tunnel layer 22, the barrier layer 26 can be film-formed simultaneously with a formation process of the tunnel layer. In the structure depicted in FIG. 10, a accumulation operation of 2-bit/4F$^2$ can be performed, and just forming the embedded layer in the Fin portion enables improving a bit density.

The charge accumulation layer in the non-volatile semiconductor memory (the charge accumulation type of memory) according to the foregoing embodiment has a structure where a substance having a dielectric constant sufficiently higher than a silicon nitride film is used as a base material and an appropriate amount of a high-valence substance is added in order to produce a trap level that enables entrance and exit of electrons with respect to the base material. However, the effect of the present invention cannot be obtained in some cases depending on each combination of these substances, and such cases will be explained as comparative examples hereinafter.

Comparative Example 1

Figure 12:
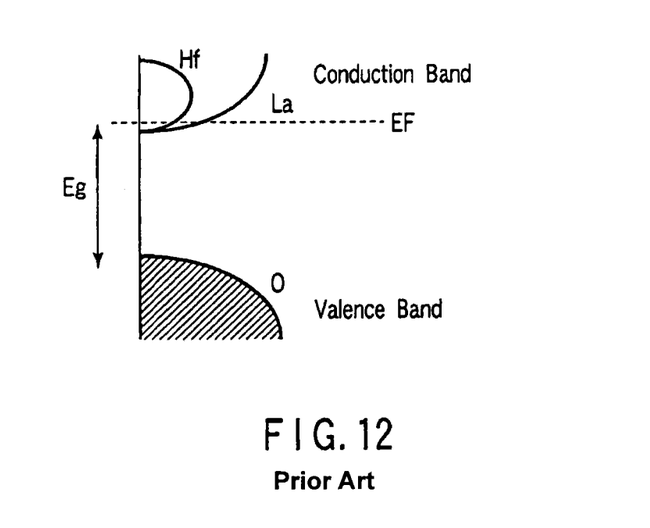
FIG. 12 is a view showing a band structure when La is introduced into a HfO$_2$ film as Comparative Example 1.

An example where La is added in $HfO_2$ as a charge accumulation layer will now be considered. This consideration can be likewise given to an example where any other lanthanoid substance (Ce, Pr, Nd, Sm, Eu, Gd, Tb, Dy, Ho, Er, Tm, Yb, or Lu) is added. As shown in FIG. 12, La in $HfO_2$ induces an oxygen defect. As a result, this state is caused to appear near a conduction band bottom, and the oxygen defect spreads in the entire film through an interaction with Hf. It has been revealed that an n-type-like picture can be thereby shown when a substance having an amount of $1\times10^{12}$ cm$^{-2}$ is added in terms of an area density.

It is considered that such a substance is introduced to increase oxygen defects. In this case, a greater part of stored electrons flows out due to local defects in the tunnel layer, and memory characteristics are very weak. This point is the same as a floating gate memory, and a thickness of the tunnel layer cannot be reduced. As a result, an interference between cells adjacent to each other becomes large, thus suppressing scaling.

Comparative Example 2

Figure 13:
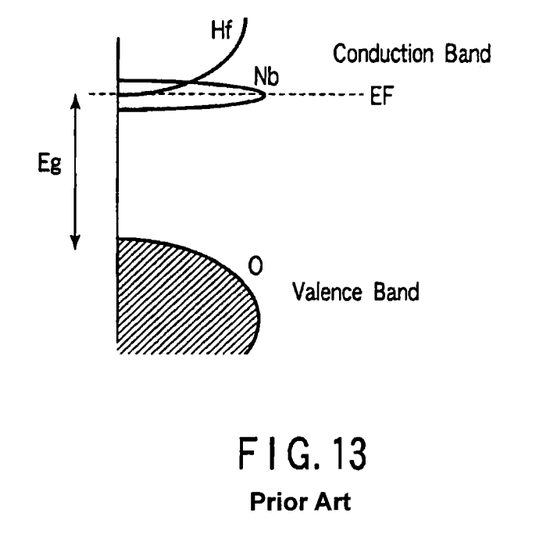
FIG. 13 is a view showing a band structure when Nb is introduced into the HfO$_2$ film as Comparative Example 3.

An example where Nb (V or Ta can be likewise used) is introduced into $HfO_2$ as a charge accumulation layer will now be considered. As shown in FIG. 13, Nb does not induce an oxygen defect like La, and Nb itself supplies electrons to an oxide, e.g., $HfO_2$. As a result, an n-type-like behavior is demonstrated. When a Ti oxide, a Zr oxide, or a Hf oxide is turned into an n type, a thickness of the tunnel layer cannot be reduced like Comparative Example 1.

Comparative Example 3

Figure 14:
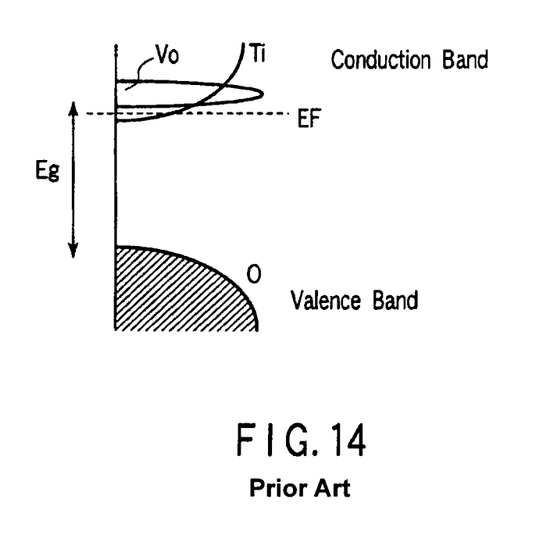
FIG. 14 is a view showing a band structure when an oxygen defect is introduced into a SrTiO$_3$ film.

An example where oxygen defects are introduced into $SrTiO_3$ as a charge accumulation layer will now be explained. As shown in FIG. 14, even though a quantity of oxygen defects is small, an n-type-like behavior is demonstrated. A Ti oxide, a Zr oxide, or a Hf oxide is turned into an n type. Like Comparative Example 1, a thickness of the tunnel layer cannot be reduced. An example where oxygen defects are introduced into a $TiO_2$ film likewise has the same band structure.

The non-volatile memory (the charge accumulation type of memory) in each of the foregoing embodiments can obtain the following functions and effects.

1) Since the charge accumulation layer having a high dielectric constant is used, a voltage applied to the charge accumulation layer can be reduced, and a large part of the voltage to be applied can be applied to the tunnel layer. As a result, writing/reading/erasing operations can be performed at a high speed with a low driving voltage. Moreover, when a dielectric constant of the second insulating layer (the block layer) used to trap electric charges is increased, the voltage can be further reduced. Additionally, when a Ti oxide is used, a high dielectric constant of 30 to 1000 can be obtained. In case of a Zr oxide or a Hf oxide, a dielectric constant of 20 to 30 can be obtained.

2) When a high-valence substance is added to a high-dielectric material formed of a Ti, Zr, or Hf oxide, a level is produced in a band gap, thus realizing sufficient charge accumulation.

3) The level produced in the band gap is very deep and stable. A film thickness of each of the tunnel layer and the block layer can be reduced in this embodiment as compared with a structure where electric charges are accumulated in a conventionally used silicon nitride layer. Additionally, a barrier of the tunnel layer can be lowered, and a reduction in film thickness and high-speed operations can be realized.

4) Electrons can be put in or taken out from the produced level. Therefore, electrons can be excessively taken out, thereby assuring a large threshold shifting range. As a result, multiple values can be readily realized.

5) Since the film does not become an n-type semiconductor like a structure based on control using oxygen defects, electric charges can be prevented from being lost due to a local defect in the tunnel layer.

6) When the base material having a high dielectric constant is used, a charge trapping cross-sectional area can be increased, and hence a charge trapping efficiency is increased, thereby improving threshold controllability.

It is to be noted that the structural example where the memory cell structure according to the embodiment on the silicon substrate is formed has been explained in this embodiment, but the present invention is not restricted thereto. The silicon layer may be formed on a substrate other than the silicon substrate, e.g., a glass substrate to constitute the memory cell structure according to this embodiment. Utilizing this structure enables forming the non-volatile semiconductor memory in a control drive circuit of a display element, e.g., a liquid crystal display element. Besides the glass substrate, the present invention is not restricted to a specific substrate as long as it is a substrate that can resist a process temperature in molding, e.g., a ceramics substrate or a substrate that does not produce an unnecessary gas in the process.

As explained above, the non-volatile semiconductor memory according to each of the foregoing embodiments can be mounted on a stationary or portable electronic device (e.g., a personal computer, a telephone, a PDA, a television set, a navigation system, or recording/reproducing device) and utilized with data, application software, or a program stored therein. Further, the non-volatile semiconductor memory can store picture data/voices in an imaging device (e.g., a digital still camera or a digital video camera). Furthermore, functions of a memory or a hard disk drive (an HDD) mounted on a household electrical appliance or a multifunction printer/FAX machine that performs communication through a network, e.g., the Internet or an LAN network can be readily carried out in place of such a memory or HDD. As explained above, like a memory or an HDD in a conventional device, the present invention is very useful for data storage or temporary saving. Furthermore, in a circuit of an electronic component, the present invention can be mounted on a memory mixed type system that uses a non-volatile memory as an internal memory or a cache memory in a system LSI or a part of the electronic circuit. In a more sophisticated way, using the present invention as a rewritable system LSI that rewrites a system (e.g., a function of a circuit) as required is also assumed.

It is to be noted that the MONOS-type flash memory has been explained as an example in each of the foregoing embodiment, but the present invention can be readily applied to, e.g., a system LSI in which a memory circuit having an integrated MONOS-type flash memory and a logic circuit are mounted on the same chip, which falls within the scope of the present invention. Besides, persons skilled in the art can give thought to various kinds of alternative examples and modifications, and it can be understood that these alternatively examples and modifications belong to the scope of the present invention.

As explained above, according to the embodiments of the present invention, a charge accumulation amount can be improved to greatly increase a threshold shifting range, and a large part of a voltage applied to a space between the gate and the channel can be applied to the tunnel film, thereby providing the non-volatile semiconductor memory that performs writing, reading, and erasing operations at high speed with a low voltage.

What is claimed is:

1. A non-volatile semiconductor memory comprising:
a semiconductor substrate having a source region, a drain region, and a channel region located between the source region and the drain region; and
a gate multi-layer formed on the channel region and obtained by sequentially stacking the following:
a first insulating layer that is formed on the channel region;
a charge accumulation layer that is formed of an oxide dielectric film, at least one of titanium (Ti), zirconium (Zr) and hafnium (Hf) which is present as a base material in the oxide dielectric film is substituted by at least one of W, Mo, Cr, Mn and Fe which is introduced as an additive substance;
a second insulating layer; and
a memory gate electrode,
wherein an area density of the substance W, Mo, Cr, Mn or Fe introduced into the oxide dielectric film falls within a range of $1\times10^{12}$ to $1\times10^{14}$ cm$^{-2}$ and a film thickness of the first insulating layer is 0.5 to 5 nm.

2. The memory according to claim 1,
wherein the first insulating layer is a single-layer formed of at least one of a silicon oxide film, a silicon oxynitride film and a silicon nitride film, or a multi-layer formed of at least one of a silicon oxide film, a silicon oxynitride film, and a silicon nitride film.

3. The memory according to claim 1,
wherein an area density of at least one of the substances W, Mo, Cr, Mn or Fe introduced into the oxide dielectric film falls within a range of $5\times10^{12}$ to $0.7\times10^{14}$ cm$^{-2}$.

4. The memory according to claim 1,
wherein the oxide dielectric film is a single-layer formed of at least one of $TiO_2$, $SrTiO_3$ and $(Ba, Sr, Ca)TiO_3$, or a multi-layer thereof.

5. The memory according to claim 1,
wherein the oxide dielectric film is a single-layer formed of at least one of $ZrO_2$, $SrZrO_3$, $(Ba, Sr, Ca)ZrO_3$, $La_2Zr_2O_7$, $HfO_2$, $SrHfO_3$, $(Ba, Sr, Ca)HfO_3$ and $La_2Hf_2O_7$, or a multi-layer thereof.

6. The memory according to claim 1,
wherein the second insulating layer is a single-layer formed of at least one of $La_2AlO_3$, $Al_2O_3$, AlN, AlNO, $ZrO_2$, $SrZrO_3$, $(Ba, Sr, Ca)ZrO_3$, $La_2Zr_2O_7$, $HfO_7$, $SrHfO_3$, $(Ba, Sr, Ca)HfO_3$ and $La_2Hf_2O_7$, or a multi-layer thereof.

7. The memory according to claim 6,
wherein the second insulating layer includes a region or a thin film that is shifted from a stoichiometry to a metal-rich side within an area density range of $2.5\times10^{12}$ to $1\times10^{14}$ cm$^{-2}$.

8. A non-volatile semiconductor memory comprising:
a semiconductor substrate having a source region, a drain region, and a channel region located between the source region and the drain region; and
a gate multi-layer formed on the channel region and obtained by sequentially stacking the following:
a first insulating layer that is formed on the channel region;
a charge accumulation layer that is formed of $ABO_3$ perovskite type oxide dielectric material, wherein the A is at least one of Ca, Sr, Ba, and the B is at least one of titanium (Ti), zirconium (Zr) and hafnium (Hf) which is included as a base material in the oxide dielectric film, being substituted by at least one of W, Mo, Cr, Mn and Fe which is introduced as an additive substance;
a second insulating layer; and
a memory gate electrode,
wherein an area density of the substance W, Mo, Cr, Mn or Fe introduced into the oxide dielectric film falls within a range of $1\times10^{12}$ to $1\times10^{14}$ cm$^{-2}$ and a film thickness of the first insulating layer is 0.5 to 5 nm.

9. The memory according to claim 8,
wherein the first insulating layer is a single-layer formed of at least one of a silicon oxide film, a silicon oxynitride film and a silicon nitride film, or a multi-layer thereof.

10. The memory according to claim 8,
wherein an area density of at least one of the substances W, Mo, Cr, Mn or Fe introduced into the oxide dielectric film falls within a range of $5\times10^{12}$ to $0.7\times10^{14}$ cm$^{-2}$.

11. The memory according to claim 8,
wherein the oxide dielectric film is a single-layer formed of at least one of $SrTiO_3$ and $(Ba, Sr, Ca)TiO_3$, or a multi-layer thereof.

12. The memory according to claim 8,
wherein the oxide dielectric film is a single-layer formed of at least one of $SrZrO_3$, $(Ba, Sr, Ca)ZrO_3$, $SrHfO_3$, and $(Ba, Sr, Ca)HfO_3$, or a multi-layer thereof.

13. The memory according to claim 8,
wherein the second insulating layer is a single-layer formed of at least one of $La_2AlO_3$, $Al_2O_3$, AiN, AiNO, $ZrO_2$, $SrZrO_3$, $(Ba, Sr, Ca)ZrO_3$, $La_2Zr_2O_7$, $HfO_7$, $SrHfO_3$, $(Ba, Sr, Ca)HfO_3$ and $La_2Hf_2O_7$, or a multi-layer thereof.

14. The memory according to claim 13,
wherein the second insulating layer includes a region or a thin film that is shifted from a stoichiometry to a metal-rich side within an area density range of $2.5\times10^{12}$ to $1\times10^{14}$ cm$^{-2}$.

* * * * *